United States Patent
Kim

(10) Patent No.: US 6,432,834 B1
(45) Date of Patent: Aug. 13, 2002

(54) METHOD FOR ENHANCING ETCH SELECTIVITY OF METAL SILICIDE FILM TO POLYSILICON FILM, AND METHOD FOR ETCHING STACKED FILM OF METAL SILICIDE FILM AND POLYSILICON FILM

(75) Inventor: Jung-hyung Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/595,847

(22) Filed: Jun. 16, 2000

(30) Foreign Application Priority Data

Jul. 14, 1999 (KR) ............................................. 99-28403

(51) Int. Cl.⁷ .......................................... H01L 21/302
(52) U.S. Cl. ....................... 438/714; 438/720; 438/721
(58) Field of Search ................................ 438/706, 710, 438/711, 712, 714, 720, 721, 733

(56) References Cited

U.S. PATENT DOCUMENTS

| | | | |
|---|---|---|---|
| 5,160,408 A | 11/1992 | Long | 156/656 |
| 5,441,595 A | 8/1995 | Yamagata et al. | 156/643.1 |
| 5,994,234 A * | 11/1999 | Ouchi | 438/719 |
| 6,008,139 A * | 12/1999 | Pan et al. | 438/730 |
| 6,074,954 A * | 6/2000 | Lill et al. | 438/710 |

* cited by examiner

Primary Examiner—Benjamin L. Utech
Assistant Examiner—Kin-Chan Chen
(74) Attorney, Agent, or Firm—Mills & Onello, LLP

(57) ABSTRACT

An etching method in which the etch selectivity of a metal silicide film with respect to a polysilicon film can be increased when a polycide film is etched by plasma enhanced etching, is provided. This method is accomplished by repeating (a) plasma etching the metal silicide film with a plasma source power applied to an etch chamber, using etch gas ions accelerated by applying a bias power to a substrate, and (b) chemically adsorbing the etch gas ions on the metal silicide film and oxidizing the polysilicon film exposed using the etch gas ions, by continuously applying the plasma source power to the etch chamber and preventing application of the bias power applied to the substrate or applying a level of bias power at which the etch gas ions are not accelerated. Accordingly, an etch prevention film is formed on only a polysilicon film which is exposed by modulating a bias power, upon plasma etching of a polycide film, thereby increasing the etch selectivity of a metal silicide film with respect to the polysilicon film. Thus, during etching of the polycide film, a substrate can be prevented from being damaged due to abnormal etching of the polysilicon film, thus increasing the reliability of semiconductor devices.

17 Claims, 7 Drawing Sheets

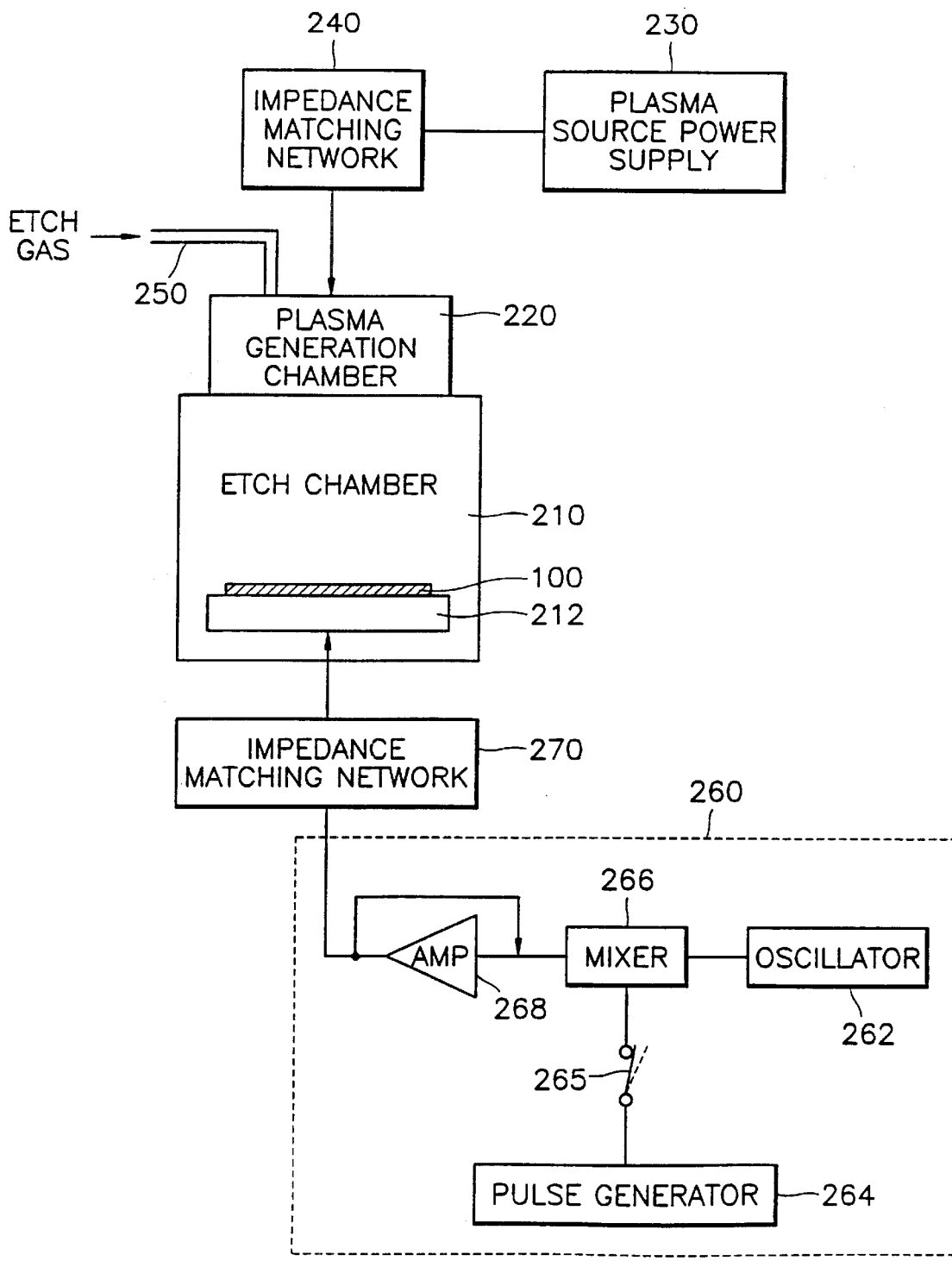

METHOD FOR ENHANCING ETCH SELECTIVITY OF METAL SILICIDE FILM TO POLYSILICON FILM, AND METHOD FOR ETCHING STACKED FILM OF METAL SILICIDE FILM AND POLYSILICON FILM

BACKGROUND OF THE INVENTION

1. Field of the Invention

The present invention relates to a plasma etching process utilized in the fabrication of semiconductor devices, and more particularly, to a method for etching a stacked film comprising a polysilicon film and a metal silicide film using a plasma enhanced etching process.

2. Description of the Related Art

As the integration density of semiconductor devices increases, the line width of conductive layer interconnect patterns forming the semiconductor device gradually decreases. However, a reduction in the line width of conductive layer patterns results in a corresponding increase in line resistance. As a consequence, operating speed is reduced. Hence, a stacked film comprising a polysilicon film and a metal silicide film (hereinafter, referred to as a polycide film) has recently been developed in order to reduce the resistance of the conductive layer, for example a gate electrode or bit line. However, polycide film is subject to various limitations during pattern etching.

In order to form a desired conductive layer pattern (for example, a gate electrode) using a polycide film, first, as shown in FIG. 1, a gate dielectric film 20 is formed on a substrate 10 (which may be an interlayer dielectric layer when the conductive layer pattern is a bit line), and a polycide film comprising a staked polysilicon film 30 and metal silicide film 40, e.g., a tungsten silicide ($WSi_x$) is formed thereon. Subsequently, an etch mask 50 having a desired pattern is formed of a material such as silicon nitride.

Next, the polycide film 30+40 is etched through the etch mask 50. To accomplish this, first, the tungsten silicide film 40 is etched using a predetermined first etch gas. Following this, the first etch gas is replaced by a second etch gas for etching the polysilicon film 30. Accordingly, the polysilicon film 30 is etched.

Here, a mixed gas of $O_2$ and $Cl_2$, or a gas obtained by providing a small amount of $SF_6$ in the mixed gas, are typically employed as the etch gas for etching the tungsten silicide film 40. The etch gas has a relatively low etch selectivity of tungsten silicide film 40 with respect to the polysilicon film 30. Accordingly, as shown in FIG. 2, tungsten silicide residue 44 remains on the polysilicon film due to incomplete etching of the tungsten silicide film 42. In this state, the exposed portions of the polysilicon film 32 are partially etched as shown at reference character A. The grooves A formed in the polysilicon film 32 cause non-uniform etching of the polysilicon film 32, leading to substrate 10 damage in some circumstances. Furthermore, as the thickness of the polycide film is reduced in accordance with recent trends toward reducing the total height of semiconductor devices, such grooves A may have a negative impact on the resultant fabricated devices.

SUMMARY OF THE INVENTION

An object of the present invention is to provide a method for increasing the etch selectivity of a metal silicide film to a polysilicon film.

Another object of the present invention is to provide a plasma enhanced etching method for a polycide film by which a uniform and suitable etching profile can be obtained.

To achieve the above object, the present invention provides a method of increasing the etch selectivity of a metal silicide film with respect to a polysilicon film. According to the method, after a substrate on which a polycide film has been formed is loaded on a plasma etching chamber, the following steps are performed.

In step (a), a plasma source power is applied to an etch chamber, and a bias power is applied to the substrate. Thus, etch gas ions are accelerated by the applied plasma source power, thereby plasma-etching the metal silicide film.

In step (b), the plasma source power is continuously applied to the etch chamber, and bias power is provided to the substrate at a level at which the etch gas ions are not accelerated. Thus, the etch gas ions are chemically adsorbed to the metal silicide film, and the exposed polysilicon film is oxidized.

In step (c), the plasma source power is continuously applied to the etch chamber, and a bias power is applied to the substrate. Thus, the etch gas ions are accelerated, so that the etch gas ions adsorbed on the metal silicide film during step (b) are etched out, wherein an oxide film formed on the polysilicon film during step (b) is not etched out and serves as a film for preventing etching of the polysilicon film.

The steps (b) and (c) can be repeated until the metal silicide film on the polysilicon film is completely etched.

In preferred embodiment, the cycle of repetition of steps (b) and (c) ranges between 1 Hz to 100 kHz, and the ratio of the duration of the step (c) to the duration of the step (b) ranges from 1:9 to 9:1. The level of bias power applied during step (b) may be substantially equal to zero.

In a method of etching a polycide film using a method of increasing the etch selectivity of a metal silicide film with respect to the polysilicon film, first, the polycide film is formed on a substrate, and an etch mask which is used to etch the polycide film into a predetermined pattern is formed on the polycide film. Next, in a plasma etching chamber, an etch gas which is a mixed gas of $Cl_2$ and $O_2$ is supplied to the polycide film. Next, a plasma source power is applied to the plasma etching chamber, and a pulse-modulated bias power having a first "on" period and a second "off" period is applied to the substrate. Here, the "on" period is a period during which a level of power at which etch gas ions excited by the plasma source power are accelerated is applied, and the "off" period is a period during which a level of power at which the etch gas ions are not accelerated is applied. Thus, during the "on" period, etch gas ions are accelerated to etch the metal silicide film exposed by the etch mask. During the "off" period, the etch gas ions are chemically adsorbed on the metal silicide film, and the exposed polysilicon film is oxidized. Finally, the polysilicon film on the substrate from which the metal silicide film has been completely etched out, and a silicon oxide film formed on the polysilicon film are etched using the etch mask.

In this method, the cycle of the pulse-modulated bias power applied to the substrate preferably ranges from 1 Hz to 100 kHz, and the ratio of the "on" period to the "on-off"

cycle ("on" period+"off" period) of the bias power preferably ranges from 0.1 to 0.9. The level of bias power applied during the "off" period may be substantially equal to zero.

In the present invention as described above, while a bias power is being applied to a substrate, a metal silicid[0085] film is etched. On the other hand, when the bias power is not applied, or while the bias power is being applied at a level within a range that does not accelerate etch gas ions, the etch selectivity of a metal suicide film with respect to a polysilicon film can be increased even if an etch gas having a low etch selectivity is used, by forming an oxide film, which is an etching prevention film, on the exposed portions of the polysilicon film. Thus, a uniform and suitable etching profile of a polycide film is obtained.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3 is a block diagram of a plasma etching apparatus used to etch a polycide film according a method of the present invention.

DESCRIPTION OF THE PREFERRED EMBODIMENT

Figure 1:
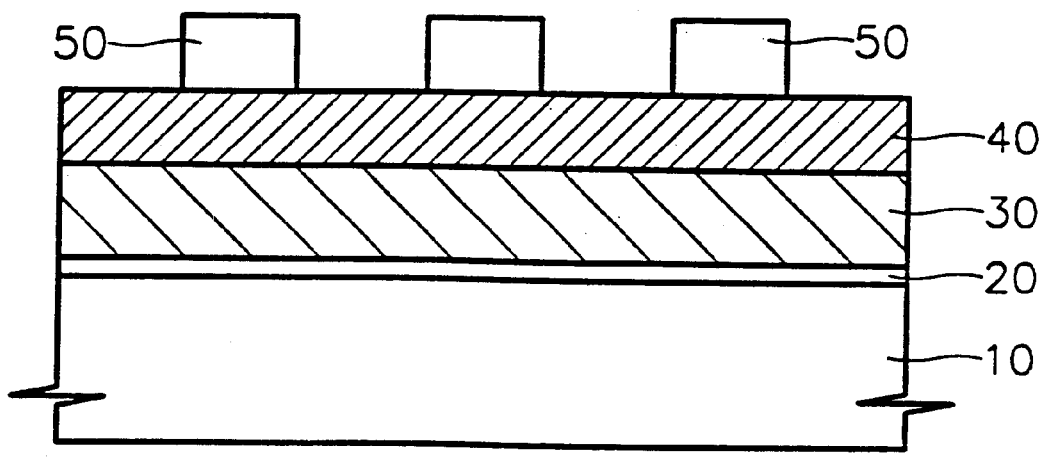
FIGS. 1 and 2 are cross-sectional views illustrating a conventional polycide film etching method.

Referring to FIG. 3, a plasma etching apparatus for etching a polycide film, according to the present invention, includes an etch chamber 210 in which etching is performed, a plasma generation chamber 220, a plasma source power supply 230, a bias power supply 260, and impedance matching networks 240 and 270. The plasma generation chamber 220 ionizes an etch gas which is supplied via an etch gas inlet 250. The plasma source power supply 230 supplies a plasma source power to the plasma generation chamber 220. The bias power supply 260 supplies a bias power to a susceptor 212 on which a wafer 100 is loaded, in the etch chamber 210. The impedance matching networks 240 and 270 are circuits which match the impedance of power supplied from the plasma source power supply 230 and the impedance of power supplied from the bias power supply 260, respectively.

The plasma generation chamber 220 can be installed separately from the etch chamber 210, as shown in FIG. 3, or may be installed in the form of a coil around the etch chamber 210 rather than in the form of a chamber. Examples of plasma generation methods include inductively coupled plasma (ICP), transformer coupled plasma (TCP), surface wave plasma (SWP), electron cyclotron resonance (ECR), and helicon wave plasma (HWP) generation methods. The present invention is equally applicable to any of the above-enumerated techniques as well as additional plasma generation techniques, depending on the application.

A radio frequency wave or a microwave is generally used as a source of power which is supplied from the plasma source power supply 230, and a radio frequency wave having a frequency of 100 kHz to 30 MHz is generally used as a bias power which is supplied from the bias power supply 260 and accelerates etch gas ions.

The bias power supply 260 includes an oscillator 262 for generating a radio frequency wave having a constant frequency, a pulse generator 264 for generating a pulse having a predetermined period, a mixer 266 for mixing a radio frequency wave generated by the oscillator 262 with a pulse generated by the pulse generator 264, and a radio frequency (RF) amplifier 268 for amplifying a bias power which has been modulated by the mixer 266.

Figure 4A:
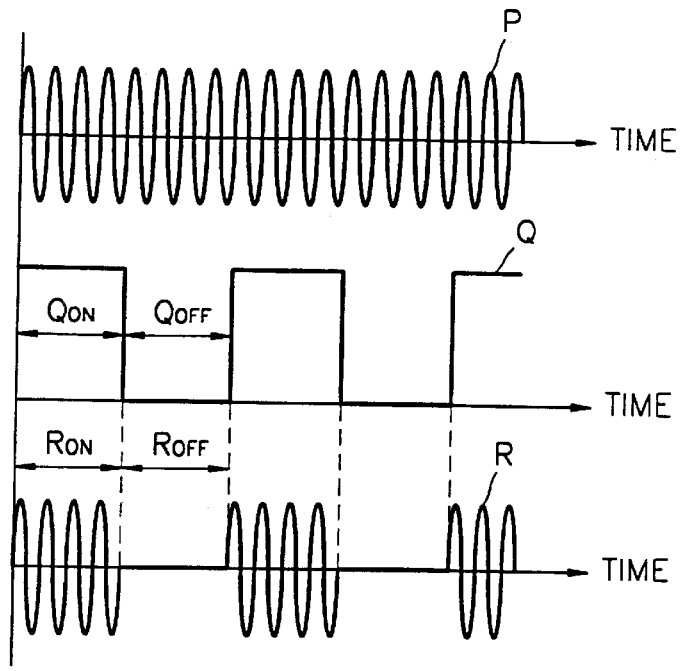
FIGS. 4A and 4B are waveform diagrams illustrating a process for modulating a bias power according to the present invention.

FIG. 4A shows an example of the power waveforms supplied from the oscillator 262, pulse generator 264 and mixer 266 in the bias power supply 260. Referring to FIG. 4A, a radio frequency wave P with a constant frequency and constant amplitude generated by the oscillator 262 is mixed with a pulse Q generated by the pulse generator 264, which has an "on" period $Q_{ON}$ and an "off" period $Q_{OFF}$, at the mixer 266, resulting in a pulse-modulated radio frequency wave R having an "on" period $R_{ON}$ and an "off" period $R_{OFF}$. Here, $Q_{ON}$ is equal to $R_{ON}$, and $Q_{OFF}$ is equal to $R_{OFF}$. Also, the frequency of the pulse-modulated radio frequency wave R in the "on" period $R_{ON}$ is preferably equal to that of the radio frequency wave P generated by the oscillator 262. The bias power supply 260 also includes a switch 265 for controlling application of the output of the pulse generator 264 to the mixer 266. When the switch 265 is switched off, the radio frequency wave P generated by the oscillator 262 may be provided to the amplifier 268 without pulse modulation.

A plasma etching apparatus having such a configuration is disclosed in U.S. Pat. No. 5,441,595, directed to a method of forming a via hole having a beneficial etching profile using a plasma etching apparatus. An isotropic etching is performed when the modulated bias power is in an "on" period, and isotropic etching is performed when the modulated bias power is in an "off" period.

Figure 4B:
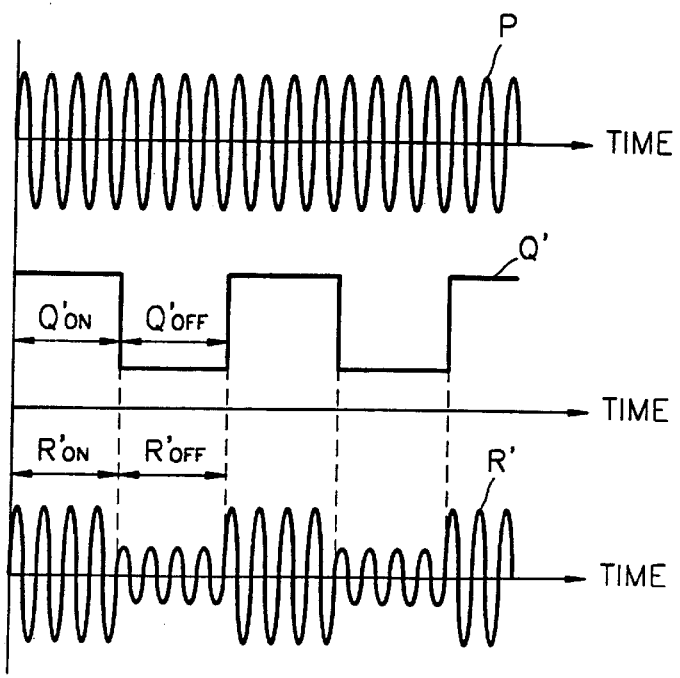

The present invention builds on this concept to provide for increased etch selectivity of a polycide film using the plasma etching apparatus described above. FIG. 4B shows another example of the waveforms of power supplied from the oscillator 262, pulse generator 264, and mixer 266 in the bias power supply 260. The waveforms shown in FIG. 4B are different from those shown in FIG. 4A in that the voltage during the "off" periods $Q'_{OFF}$ of a pulse Q' which is supplied from the pulse generator 264 is not zero, in contrast with the pulse Q of FIG. 4A. Instead, the voltage during the "off" period $Q'_{OFF}$ of the pulse Q' is less than the voltage during the "on" periods $Q'_{ON}$ of the pulse Q'. Thus, the voltage during the "off" periods $R'_{OFF}$ of the resulting mixed radio frequency wave R' which has been pulse-modulated by the mixer 266, is not zero.

A method and apparatus for increasing the etch selectivity of a polycide film using the plasma etching apparatus, will now be described in detail with reference to the FIG. 5. The example of FIG. 5, which is a cross-sectional view illustrating a process for etching a polycide film according to the present invention, is directed to the case where the polycide film forms a gate electrode. However, the polycide film etching method is equally applicable to the case where the polycide film forms another conductive layer, e.g., a bit line.

First, a gate dielectric film 120 is formed on a substrate 110. When a polycide film forms a bit line, the substrate 110 serves as an interlayer dielectric layer. Next, a polycide film, comprising a polysilicon film and a metal silicide film (e.g., a tungsten silicide film), is deposited, and an etch mask 150 is then formed of a material such as silicon nitride.

The resulting wafer 100 (see FIG. 3) is loaded in a plasma etching apparatus as shown in FIG. 3, and etch gas is supplied. Next, the metal silicide film is first etched by applying a plasma source power and a bias power. Here, the etch gas preferably comprises a 1:3 ratio by volume of an $O_2$-to-$Cl_2$ gas mixture. Also, $SF_6$ gas may be added to the gas mixture in an amount of 10% or less of the gas mixture. The plasma source power is preferably 300 to 700 W, the bias power is preferably 50 to 300 W, the pressure of the etch chamber 210 is preferably maintained at about 1 to 10 mTorr, and the temperature of the substrate is preferably set to room temperature.

Next, etch gas ions which have been ionized by the plasma source power are. accelerated by the bias power, thus etching the exposed portions of the metal silicide film. At this time, the switch 265 is kept in an "off" position until the polysilicon film is exposed, so that the radio frequency wave P generated by the oscillator 262 is applied to the wafer 100 without being modulated by the pulse waveform. Alternatively, the modulated radio frequency wave R may be applied to the wafer 100 by keeping the switch 265 in an "on" position.

Figure 2:
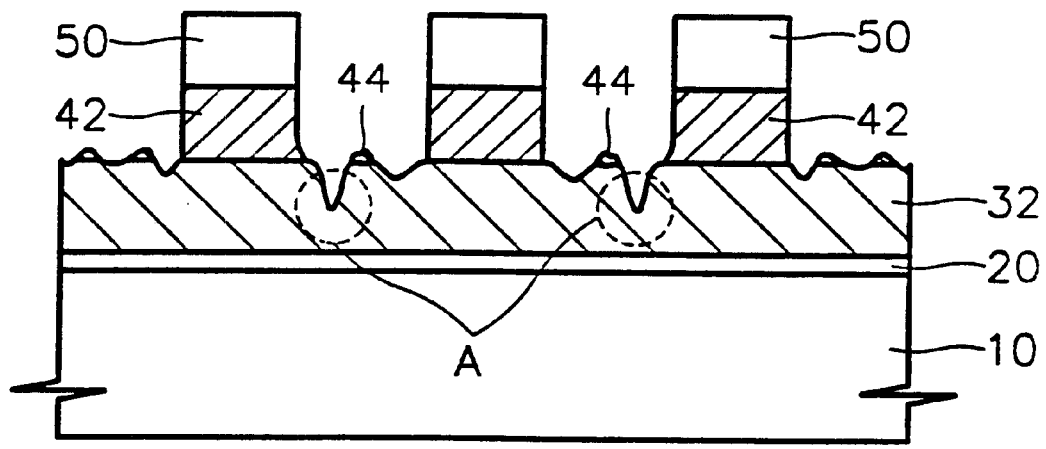
Figure 5:
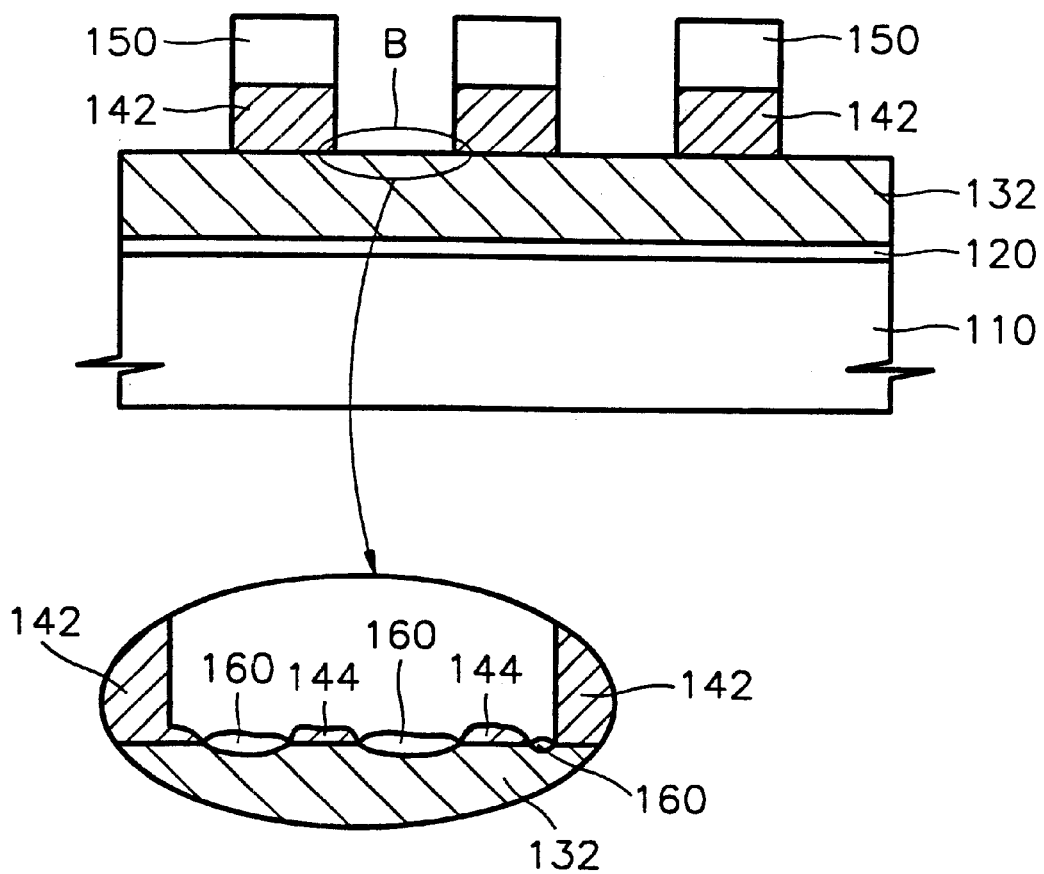
FIG. 5 is a cross-sectional view illustrating a process for etching a polycide film according to the present invention.

Following a predetermined time period, as shown in FIG. 5, the metal silicide film 142 is etched, and the polysilicon film 132 becomes exposed. At this point, ,the switch 265 is turned on, so as to apply the modulated radio frequency wave R. As shown in FIG. 5, when the polycide film (strictly speaking, the metal silicide film) is etched using the modulated radio frequency wave R, only the metal silicide film 142 is etched, resulting in a proper profile, and the surface of the polysilicon film 132 is not damaged. Referring to the magnified surface B of the polysilicon film 132 in the lower portion of FIG. 5, metal silicide etch residue 144 remains on the surface B of the polysilicon film 132, and a silicon oxide film 160 is formed on the exposed portions of the polysilicon film 132 surface, that is the portions absent metal silicide etch residue 144. The silicon oxide film 160, which is formed during time periods when the modulated radio frequency wave R is "off" $R_{OFF}$, serves as an etching prevention film for preventing the polysilicon film 132 from being etched during the time when the modulated radio frequency wave R is in an "on" period $R_{ON}$. Thus, even though the polysilicon film 132 is partially exposed, it is not etched, and no grooves A (see FIG. 2) are generated, in contrast to the conventional approaches discussed above. This process will now be described in more detail with reference to FIGS. 6A through 7B.

Figure 6A:
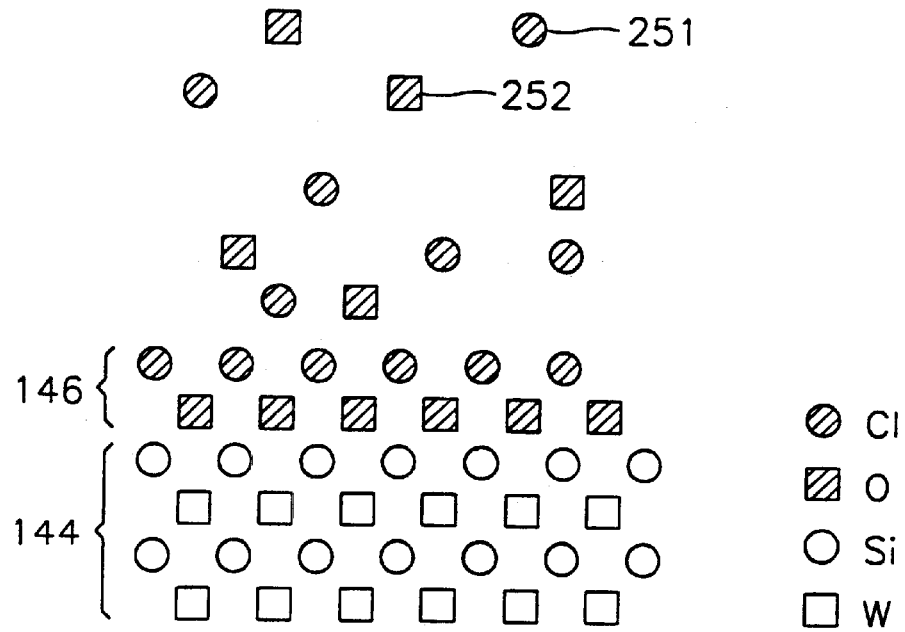
FIGS. 6A, 6B, 7A and 7B are conceptual views illustrating a process in which the etch selectivity of a metal silicide film with respect to a polysilicon film increases during etching of a polycide film according to the present invention.

FIG. 6A is a conceptual view illustrating the process occurring on the tungsten silicide etch residue 144 formed during instances when the modulated radio frequency wave R is in an "off" period $R_{OFF}$. In FIG. 6A, the rate of etching is slowed and/or stopped due to unaccelerated etch gas ions 251 and 252, which are chemically adsorbed on top of the tungsten suicide etch residue 144 as shown at layer 146. The bias power does not necessarily need to be set to zero in order for the etch gas ions 251 and 252 to be adsorbed without being accelerated as described above. That is, the etch gas ions 251 and 252 are prone to being adsorbed on a polycide film rather than etching the same, even when a bias power within a predetermined power range is applied. In the present embodiment, when a bias power of about 0 to 40 W is applied, adsorption occurs rather than etching. Thus, the modulated radio frequency wave R' shown in FIG. 4B can be used instead of the modulated radio frequency wave R shown in FIG. 4A. However, in this case, the voltage when the pulse Q' is in "off" periods $Q'_{OFF}$ must be controlled so that the applied power is within the specified range when the modulated radio frequency wave R' amplified by the RF amplifier 268 is in "off" periods $R'_{OFF}$.

Figure 6B:
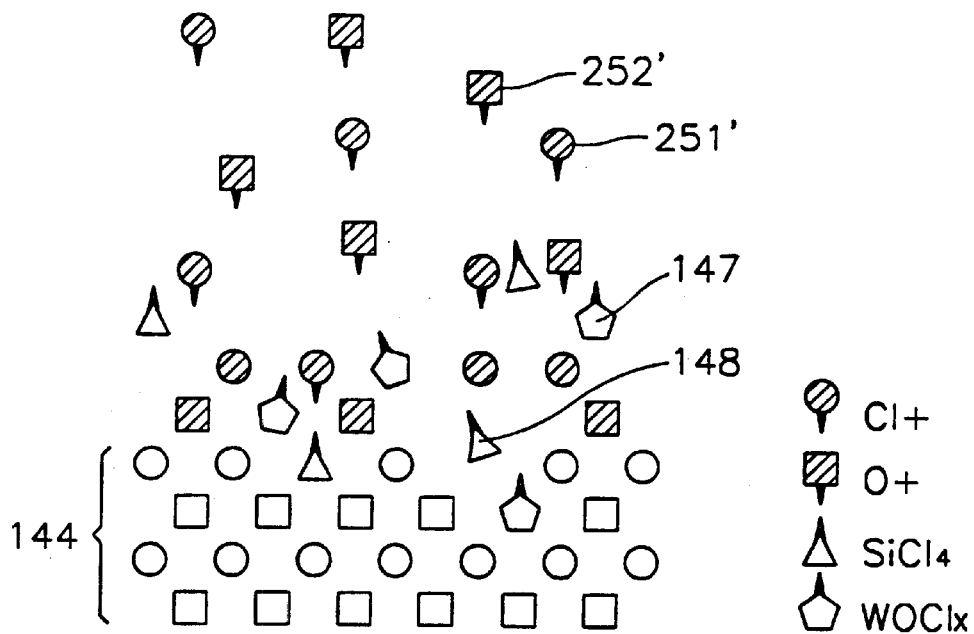

Subsequently, when the modulated radio frequency wave R is in the "on" periods $R_{ON}$, etch gas ions 251' and 252' are accelerated, and the layer 146 formed when the modulated radio frequency wave R is in the "off" periods $R_{OFF}$, and the tungsten silicide etch residues 144 are etched out while generating $WOCl_x$ 147 and $SiCl_4$ 148 molecules, as shown in FIG. 6B.

Figure 7A:
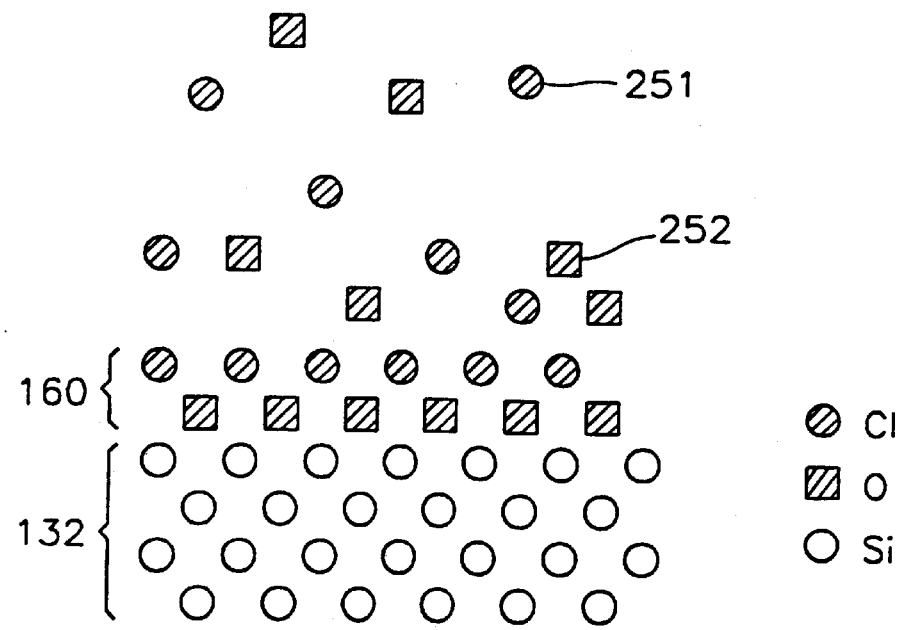
Figure 7B:
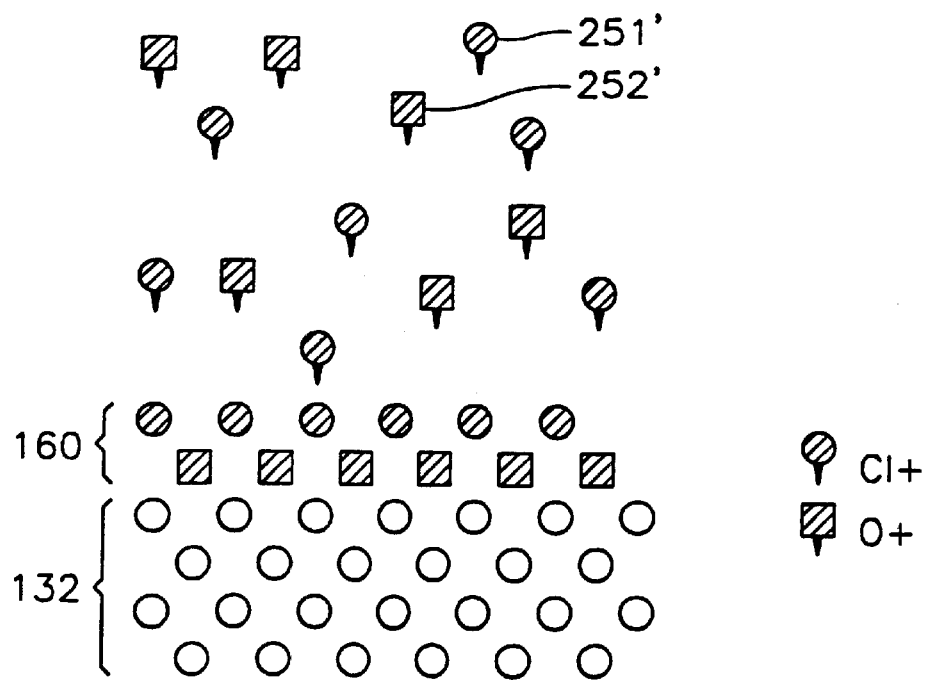

On the other hand, as shown in FIG. 7A, when the modulated radio frequency wave R is in the "off" periods $R_{OFF}$, unaccelerated etch gas ions 251 and 252 are also adsorbed on the exposed portions of the polysilicon film 132, as shown at a layer 160. At this time, particularly, oxygen ions are adsorbed on the polysilicon film 132 to thus form a silicon oxide film $SiO_2$. Then, as shown in FIG. 7B, when the modulated radio frequency wave R is in the "on" periods $R_{ON}$, even though the etch gas ions 251' and 252' are accelerated and thus incident with energies, the silicon oxide film 160 formed on the polysilicon film 132 is not removed due to a weak reaction with the etch gas ions 251' and 252', thus preventing etching of the polysilicon film 132. That is, the etch selectivity of the tungsten silicide 144 with respect to the polysilicon film 132 is increased. Consequently, during repetition of these periods, the tungsten silicide is completely etched out, but the polysilicon film 132 remains with little damage.

After the tungsten suicide etch residue portions 144 are completely removed, the polysilicon film 132 is plasma-etched by a typical polysilicon etch gas (while a plasma source power and a bias power are continuously applied), thereby completing etching of the polycide film. At this time, the silicon oxide film 160 formed on the polysilicon film 132 is easily etched out since it has a thickness of only several Å to several tens of Å. That is, before etching of the polysilicon film 132, the silicon oxide film 160 is completely etched for about several seconds to several tens of seconds using a gas such as $Cl_2$ by the same manner as a method for removing a natural oxide film.

Upon etching of the tungsten silicide film, the etch rates and etch selectivity of the tungsten silicide film with respect to the polysilicon film vary according to the modulation frequency of the pulse-modulated radio frequency wave R and the duty ratio of an "on" period $R_{ON}$ in a cycle (see FIG. 4).

Figure 8:
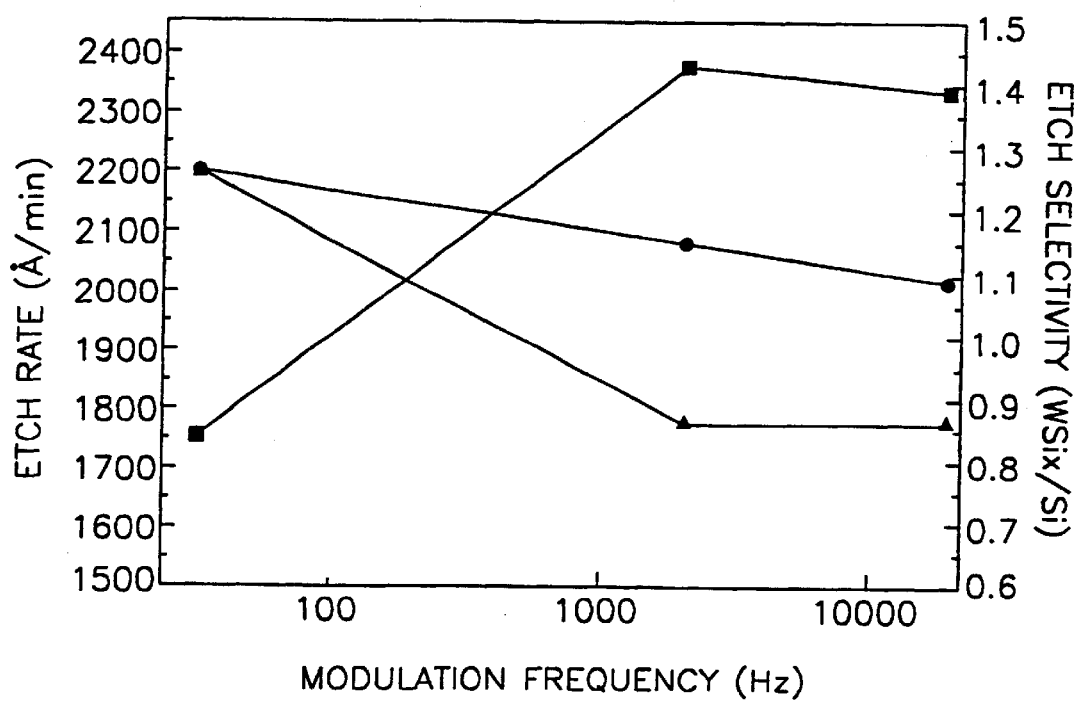
FIG. 8 is a graph showing variations in the etch rates of a polysilicon film and a metal silicide film and variations in the etch selectivity of the metal silicide film with respect to the polysilicon film, as functions of modulation frequency, when a polycide film is etched according to the present invention.

In relation to variations in etch selectivity with respect to the modulation frequency, as shown in FIG. 8, as the frequency of a pulse Q generated by the pulse generator 264, that is, the modulation frequency, increases, the etch rate ■ of the polysilicon film increases to a certain level and then slightly decreases, and the etch rate ● of the tungsten silicide film decreases. Thus, the etch selectivity ▲ of the tungsten silicide film with respect to the polysilicon film decreases to a certain level and then remains constant. The etch selectivity thus increases as the modulation frequency decreases, that is, as the period of the pulse Q increases, due to the fact that the time for forming a film (silicon oxide film) for preventing etching of a polysilicon film increases with decrease in modulation frequency. Further, the modulated bias power R applied to a substrate approaches a contiguous radio frequency wave P with little effect of modulation as the modulation frequency increases. Hence, the modulation frequency is preferably set to be within a range where the etch selectivity ▲ is greater than 1, that is, less than or equal to about 500 Hz, as shown in FIG. 8.

Also, in relation to variations in the etch selectivity with respect to the duty ratio, i.e., the ratio of the "on" period $R_{ON}$ to the "on-off" cycle ($R_{ON}+R_{OFF}$) of the modulated radio frequency wave R, it becomes evident that the etch selectivity increases with decreasing duty ratio, that is, increases in the ratio of the "off" period $R_{OFF}$ to the "on-off" cycle, since the polysilicon film etching prevention film can be formed for a more sufficient period of time as the "off" period $R_{OFF}$ increases. Thus, as the duty ratio decreases, the etch selectivity of the metal silicide film with respect to the polysilicon film increases. However, if the duty ratio decreases too drastically, the time for which the metal silicide film is etched in each "on-off" cycle is shortened, causing the overall etching time to increase. Thus, the duty ratio $R_{ON}/(R_{ON}+R_{OFF})$ is preferably controlled to be an appropriate level, that is, between 0.1 and 0.9.

In this embodiment, a tungsten silicide film was described as an example of the metal silicide film. However, the present invention is further applicable to typical metal silicide films such as a titanium silicide film, a tantalum silicide film and a molybdenum silicide film. When metal silicide films other than tungsten suicide films are employed, variations in etch selectivity with respect to modulation frequency are generally the same as those shown in the graph of FIG. 8 in schematic tendency but may be different in specific numerical values. Therefore, in this case, the modulation. frequency is appropriately set according to variations in the etch selectivity, that is, the modulation frequency is selected between 1 Hz and 100 Hz.

According to the present invention as described above, a bias power applied to a substrate is pulse-modulated to have "on" periods and "off" periods upon plasma etching of a polycide film. Thus, an etch prevention film is formed on a polysilicon film which is exposed, when the applied bias power is in the "off" periods, thereby increasing the etch selectivity of a metal silicide film with respect to the polysilicon film. Thus, during etching of the polycide film, the substrate can be prevented from being damaged due to abnormal etching of the polysilicon film, thus increasing the reliability of semiconductor devices.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of increasing the etch selectivity of a metal suicide film with respect to a polysilicon film during plasma enhanced etching of a stacked film, the stacked film comprising the polysilicon film and the metal silicide formed on a substrate, the method comprising:

(a) plasma etching the metal silicide film with a plasma source power applied to an etch chamber, by accelerating etch gas ions through application of a bias power to the substrate;

(b) chemically adsorbing the etch gas ions to the metal silicide film and oxidizing the polysilicon film exposed using the etch gas ions, by continuously applying the plasma source power to the etch chamber and applying a first bias power level less than or equal to a level at which the etch gas ions are not accelerated to the substrate; and (c) accelerating the etch gas ions by applying the plasma source power to the etch chamber and a second bias power level to the substrate, the second bias power level being greater than the first bias power level, so that the etch gas ions adsorbed on the metal silicide film in step (b) are etched out by the accelerated etch gas ions, wherein an oxide film formed on the exposed polysilicon film in step (b) serves as a film for preventing etching of the polysilicon film.

2. The method of claim 1, wherein the plasma etching of step (a) is performed until the polysilicon film is exposed due to etching of the metal silicide film, and wherein steps (b) and (c) are performed when the polysilicon film becomes exposed.

3. The method of claim 1, wherein the steps (b) and (c) are repeated until the metal silicide film on the polysilicon film is completely etched.

4. The method of claim 3, wherein the cycle of repetition of the steps (b) and (c) ranges from 1 Hz to 100 kHz.

5. The method of claim 3, wherein the ratio of the duration of the step (c) to the duration of the step (b) ranges from 1:9 to 9:1 upon repetition of the steps (b) and (c).

6. The method of claim 1, wherein the etch gas comprises a mixed gas of $Cl_2$ and $O_2$.

7. The method of claim 1, wherein the etch gas comprises a mixed gas of $Cl_2$, $O_2$ and $SF_6$.

8. The method of claim 1, wherein the metal silicide film comprises a film selected from the types of films consisting of: a tungsten silicide film, a titanium silicide film, a tantalum silicide film, and a molybdenum silicide film.

9. The method of claim 1, wherein the first bias power level applied to the substrate during step (b) is substantially equal to zero.

10. A method of etching a stacked film comprising a polysilicon film and a metal silicide film, the method comprising:

(a) forming the stacked film of the polysilicon film and the metal silicide film on a substrate, and forming an etch mask used to etch the stacked film into a pattern, on the stacked film;

(b) in a plasma etching chamber, supplying an etch gas comprising a mixed gas of $Cl_2$ and $O_2$ to the stacked film;

(c) applying a plasma source power to the plasma etching chamber and applying a pulse-modulated bias power to the substrate, the pulse modulated bias power having a first period during which a level of power at which etch gas ions excited by the plasma source power are accelerated is applied, and a second period during which a level of power at which the etch gas ions are not accelerated is applied, so that the metal silicide film exposed by the etch mask is etched by the accelerated etch gas ions during the first period, and the etch gas ions are chemically adsorbed on the metal silicide film and the exposed polysilicon film is oxidized, during the second period; and (d) etching the polysilicon film on the substrate from which the metal silicide film has been completely etched during step (c), using the etch mask.

11. The method of claim 10, wherein $SF_6$ is further mixed in the etch gas.

12. The method of claim 10, wherein the metal silicide film comprises a film selected from the types of films consisting of: a tungsten silicide film, a titanium silicide film, a tantalum silicide film, and a molybdenum silicide film.

13. The method of claim 10, further comprising between steps (b) and (c) applying a plasma source power to the etching chamber and an unmodulated bias power to the substrate until the polysilicon film becomes exposed, to accelerate the etch gas ions, so that the metal silicide film is etched.

14. The method of claim 10, wherein the cycle of the pulse-modulated bias power of steps (c) ranges from 1 Hz to 100 kHz.

15. The method of claim 10 wherein the ratio of the time duration of the first period to the combination of the first and second periods in step (c) ranges from 0.1 to 0.9.

16. The method of claim 10, further comprising between the steps (c) and (d), etching a silicon oxide film formed on the polysilicon film, using the etch mask.

17. The method of claim 10, wherein the level of bias power applied to the substrate during the second period of step (c) is substantially equal to zero.

* * * * *

UNITED STATES PATENT AND TRADEMARK OFFICE
CERTIFICATE OF CORRECTION

PATENT NO.    : 6,432,834 B1
DATED         : August 13, 2002
INVENTOR(S)   : Jung-hyung Kim It is certified that error appears in the above-identified patent and that said Letters Patent is hereby corrected as shown below:

<u>Column 8,</u>
Line 24, please change "suicide" to -- silicide --.

Signed and Sealed this

Fourth Day of February, 2003

JAMES E. ROGAN
*Director of the United States Patent and Trademark Office*